(12) United States Patent  (10) Patent No.: US 7,999,349 B2
Montanini et al.  (45) Date of Patent: Aug. 16, 2011

(54) FRONT-REAR CONTACTS OF ELECTRONICS DEVICES WITH INDUCED DEFECTS TO INCREASE CONDUCTIVITY THEREOF

(75) Inventors: Pietro Montanini, Milan (IT); Fabrizio Fausto Renzo Toia, Busto Arsizio (IT); Marta Mottura, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 181 days.

(21) Appl. No.: 11/823,693

(22) Filed: Jun. 27, 2007

(65) Prior Publication Data

US 2008/0017949 A1 Jan. 24, 2008

(30) Foreign Application Priority Data

Jun. 27, 2006 (EP) ...................................... 06116133

(51) Int. Cl.
*H01L 23/52* (2006.01)
(52) U.S. Cl. ......................... 257/503; 257/499; 257/E21
(58) Field of Classification Search .................. 257/499, 257/503, E21
See application file for complete search history.

(56) References Cited

U.S. PATENT DOCUMENTS

| 6,475,821 B2 * | 11/2002 | Honda ............................. 438/48 |
| 6,498,053 B2 | 12/2002 | Mastromatteo et al. |
| 6,838,362 B2 | 1/2005 | Mastromatteo et al. |
| 2004/0021169 A1 | 2/2004 | Leonardi |
| 2005/0090096 A1 | 4/2005 | Hou et al. |
| 2005/0101054 A1 | 5/2005 | Mastromatteo et al. |
| 2005/0156320 A1 | 7/2005 | Mastromatteo |

FOREIGN PATENT DOCUMENTS

DE 10 2004 041622 A1 3/2005
FR 2 848 724 A1 6/2004

OTHER PUBLICATIONS

European Search Report for EP 06 11 6133 dated Jan. 8, 2007.

* cited by examiner

*Primary Examiner* — Tan N Tran
(74) *Attorney, Agent, or Firm* — Lisa K. Jorgenson; Kevin D. Jablonski; Graybeal Jackson

(57) ABSTRACT

An electronic device is proposed. The device is integrated in a chip including at least one stacked layer having a front surface and a rear surface opposite the front surface, the device including: an insulating trench insulating an active region of the chip, the insulating trench having a section across each plane parallel to the front surface extending along a longitudinal line, and a front-rear contact electrically contacting the front surface to the rear surface in the active region, wherein the section of the insulating trench has a non-uniform width along the longitudinal line, and/or the device further includes at least one further insulating trench within the active region.

15 Claims, 12 Drawing Sheets

FRONT-REAR CONTACTS OF ELECTRONICS DEVICES WITH INDUCED DEFECTS TO INCREASE CONDUCTIVITY THEREOF

PRIORITY CLAIM

The present application claims the benefit of European Patent Application No. EP06116133.7, filed Jun. 27, 2006, which application is incorporated herein by reference in its entirety.

TECHNICAL FIELD

An embodiment of the present invention relates to the electronics field. More specifically, an embodiment of the present invention relates to front-rear contacts of integrated electronic devices.

BACKGROUND

Front-rear contacts are commonly provided in several electronic devices, which are integrated in a corresponding chip (so as to electrical contact a front surface of the chip to an opposed rear—or back—surface thereof).

A typical example is that of an electronic device of the Silicon On Insulator (SOI) type. These devices are integrated in a composite wafer, in which a buried insulating layer (such as of silicon oxide) separates two semiconductor layers (such as of mono-crystal silicon). Particularly, the lower (thicker) silicon layer defines a common substrate; the upper (thinner) silicon layer acts as an active layer housing the different electronic components (such as, MOSFET transistors) of the device.

The oxide layer provides a robust voltage insulation of the components in the active layer from the substrate. Moreover, DTI (Deep Trench Isolation) processes may be efficiently employed to provide lateral insulation from adjacent components that are integrated in the same device within different insulated regions of the active layer. In particular, such regions are fully insulated by means of the buried insulating layer and the DTI trenches. In addition, standard LOCOS (Local Oxidation of Silicon) or STI (Shallow Trench Isolation) processes may be used to provide a further lateral insulation of the components that are integrated in the same insulated region. Moreover, the devices of the SOI type have other important advantages. For example, they often do not suffer leakage effects between adjacent components. Moreover, the parasitic capacitances of the components integrated in the device are significantly reduced.

Usually it is desired to maintain the substrate at a predetermined voltage (for example, to avoid undesired capacitive coupling effects). Particularly, when the substrate is not directly accessible from the rear surface of the device it is typically biased to the desired voltage through a corresponding contact formed on its front surface (defined by the active layer). A typical example is a device that is mounted on a chip carrier with a flip-chip technique, wherein the front surface of the device faces the chip carrier (with its terminals that are directly connected to corresponding bumps of the chip carrier).

For this purpose, a via hole (or simply via) crossing the insulating layer of the device is provided so as to connect the two silicon layers (i.e., the active layer and the substrate). Typically, the via is formed in a dedicated insulated region of the active layer (defined by an insulating trench extending from the front surface to the insulating layer).

In the state of the art such via is obtained by selectively etching the active layer so forming a trench extending from the front surface down to the substrate. The walls of the trench are then covered by a conformal conductive layer (i.e., such as to substantially follow the profile of the underlying structure), which conductive layer further extends on the front surface so as to define the desired front-rear contact.

A drawback of the solution described above is that this trench wastes a significant area of the device. In fact, the trench typically must be wide enough to ensure that the conductive layer uniformly covers all its walls so as to be conformal (i.e., the trench has a significant so-called "step coverage"). This significantly increases the size of the whole device.

Similar considerations apply to (standard) electronic devices, which are formed on a silicon substrate directly (without any insulating layer). In this case as well, the front-rear contact is formed in a dedicated insulated region of the chip (defined by an insulating trench crossing the whole chip from the front surface to the rear surface); two opposed terminals are then arranged on the front surface and on the rear surface of the chip.

As above, the front-rear contact wastes a significant area of the device to achieve the required electrical characteristics (and especially a high conductivity); therefore, this again adversely affects the overall size of the device.

SUMMARY

In principle, an embodiment of the present invention is based on an idea of introducing defects in the region wherein the front-rear contact is formed.

In detail, an embodiment of the present invention proposes an electronic device integrated in a chip; the chip includes one or more stacked layers, which have a front surface and a rear surface, opposite the front surface. The device includes an insulating trench, which insulates an active region of the chip; the insulating trench has a section across each plane parallel to the front surface that extends along a longitudinal line. A front-rear contact electrically contacts the front surface to the rear surface in the active region. The section of the insulating trench has a non-uniform width along the longitudinal line; in addition or in alternative, the device further includes one or more further insulating trenches within the active region.

In an embodiment of the present invention, the device is of the SOI type.

An embodiment of the front-rear contact includes one or more openings, which are surrounded by a highly doped contact region.

Advantageously, each contact window formed on the front surface is spaced apart from an axis of each opening.

A quantitative definition of this displacement is also proposed.

In a different embodiment of the invention, the device is of the standard type (without any insulating layer).

In an embodiment, the section of the trench includes a main portion (which has a uniform width) and one or more projecting portions (which project inwards from the main portion).

In another embodiment, the (inner) insulating trenches have a section that extends along a further longitudinal line, concentric with the one of the (outer) trench.

In an embodiment of the invention, the projecting portions and/or the inner insulating trenches consist of one or more tapered elements (tapering inwards).

A suggested dimensioning of each tapered element is also proposed.

Particularly, the tapered element may be higher than larger.

Moreover, each tapered element is directed towards a center of symmetry of the section of the outer trench.

Alternatively, each tapered element has a corresponding axis of symmetry that is perpendicular to a corresponding side of the outer and/or inner longitudinal lines (when consisting of corresponding polygons).

As a further embodiment, the tapered elements are grouped into sets (with the corresponding tapered elements that are uniformly arranged along the outer and/or inner longitudinal lines).

The sets of tapered elements may be in turn uniformly arranged along the same longitudinal lines.

Moreover, the tapered elements of each pair of parallel sides of the relevant longitudinal line may be staggered to each other.

Another embodiment of the present invention provides a corresponding method of manufacturing this electronic device.

In an embodiment of the invention based on a device of the SOI type, openings are formed in the insulating layer before epitaxially growing a starting layer arranged on the insulating layer.

In an embodiment of the invention, an implantation process is used for increasing the conductivity of the semiconductor material surrounding the openings.

Advantageously, one or more corresponding beams of impurities may be inclined with respect to an axis of each opening.

BRIEF DESCRIPTION OF THE DRAWINGS

One or more embodiments of the present invention, as well as features and the advantages thereof, will be best understood by reference to the following detailed description, given purely by way of a non-restrictive indication, to be read in conjunction with the accompanying drawings.

It should be noted that the figures are not drawn to scale. Relative dimensions and proportions of parts of drawings have been increased or reduced in size for the sake of clarity.

DETAILED DESCRIPTION

Figure 1:
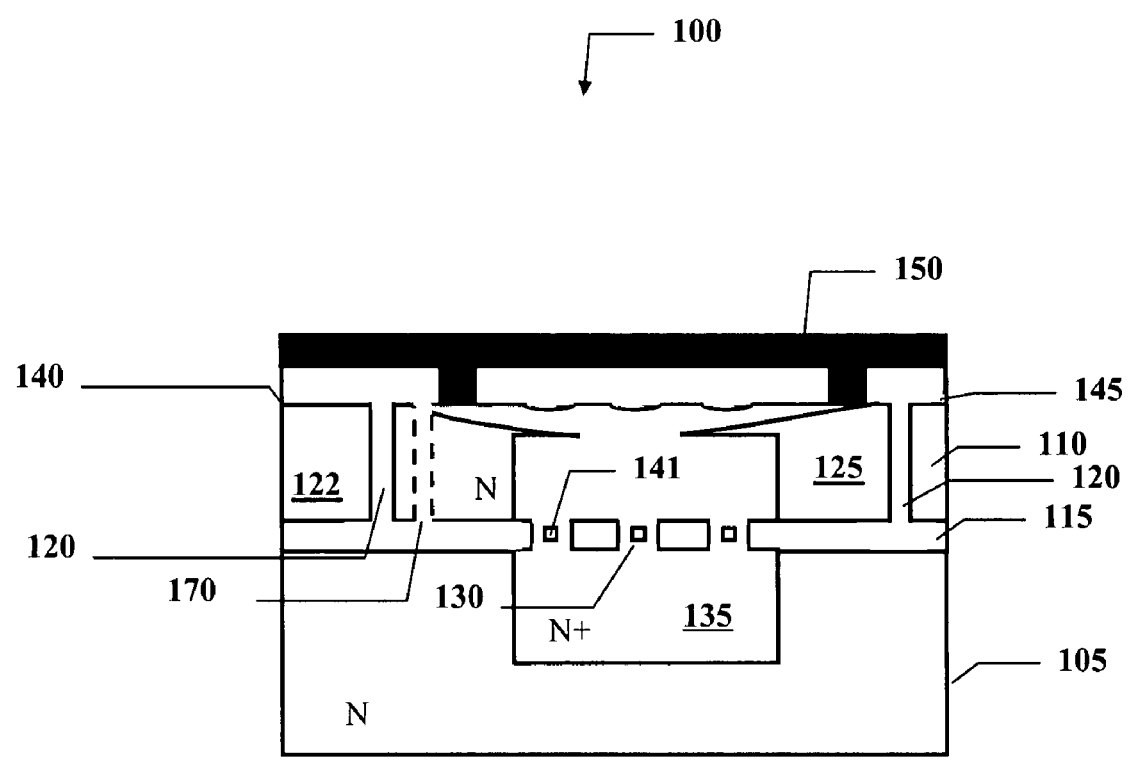
FIG. 1 shows a cross-section view of a generic SOI device according to an embodiment of the present invention.

FIG. 1 shows a cross-section view of an electronic device 100 of the SOI type. As usual, the concentrations of N-type and P-type impurities (or dopant) are denoted by adding the sign + or the sign − to the letters N and P to indicate a high or low concentration of impurities, respectively; the letters N and P without the addition of any sign + or − denote concentrations of intermediate value.

In particular, the device 100 is formed on a semiconductor substrate 105 (for example of the N type of conductivity).

The electronic components of the device 100 are integrated in a semiconductor active layer 110, which is separated from the substrate 105 by an insulating layer 115.

One or more insulating trenches 120 (for example, of the DTI type) extend from an exposed (front) surface 140 of the active layer 110 down to the insulating layer 115; the trenches 120 partition the active layer 110 into multiple insulated regions 122, which house distinct electronic components.

One (or more) of these regions (denoted with 125) defines an active region. The active region 125 is used to contact the substrate 105 from the front surface 140 of the device 100; this provides a front-rear contact through the insulating layer 115 (for example, to bias the substrate 105 at a predetermined voltage in flip-chip applications).

For this purpose (as described in detail in the following), multiple openings 130 are formed through the insulating layer 115. A highly doped contact region 135 (of the N+ type) extends from the front surface 140 down to the substrate 105, so as to enclose all the openings 130 (with the exception of a possible vacant region 141—without any semiconductor material—formed within each opening 130). A dielectric layer 145 covers the front surface 140 (flushing any recesses due to the presence of the openings 130). A contact terminal 150 on top of the dielectric layer 145 contacts the active region 125 (and more particularly an external border of the contact region 135) through corresponding contact windows opened in the dielectric layer 145.

As it will be apparent hereinafter, in the solution according to an embodiment of the present invention, crystalline defects are induced in the active region 125. More specifically, in an embodiment of the proposed solution this result is achieved by making the insulating trench 120 with a non-uniform section (across each plane parallel to the front surface 140), such as with projecting portions. In addition or in alternative, one or more auxiliary insulating trenches 170 (shown in dashed line in the figure) are formed within the active region 125.

In both cases, the added elements (i.e., the projecting portions and/or the auxiliary trenches) generate crystalline defects within the semiconductor material of the active region 125 so causing an increment of the conductivity of the front-rear contact. First of all, this is due to the fact that the crystalline defects make available energy levels (being intermediate to the proper energy gap of the silicon) such as the charge carriers may conduct more easily. Moreover, during any implantation processes of dopant ions (performed to realize the contact region 135) the crystalline defects cause the dopant ions to penetrate also into regions, which are far from the zone to be doped, so increasing their conductivity.

This allows reducing the area required to realize the front-rear contact (at the same time maintaining a high conductivity thereof).

All of the above has a beneficial impact on the size of the whole electronic device 100.

Figure 2:
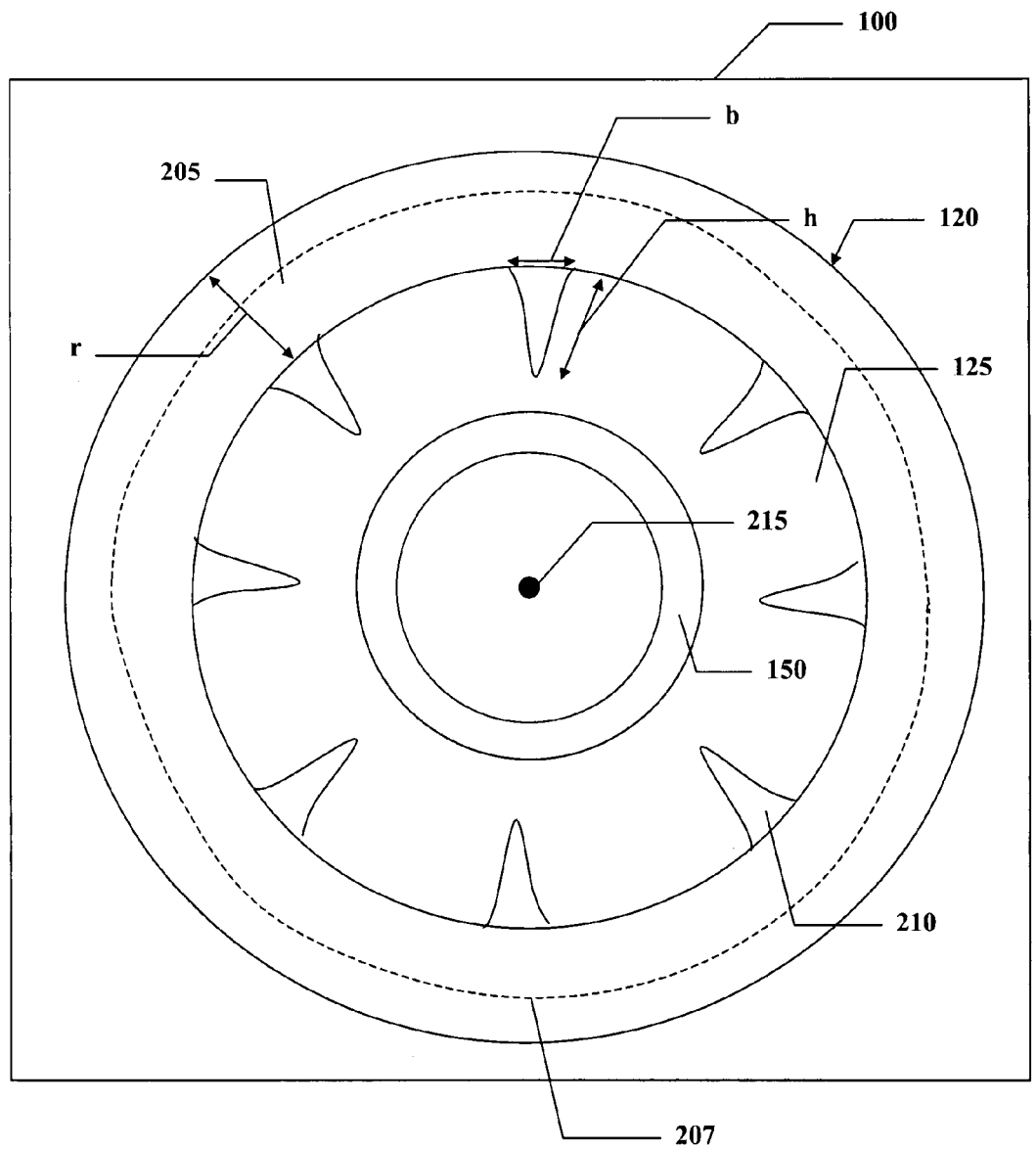
FIG. 2 shows a partially cut-away elevation view of the SOI device according to an embodiment of the present invention.
Figure 3:
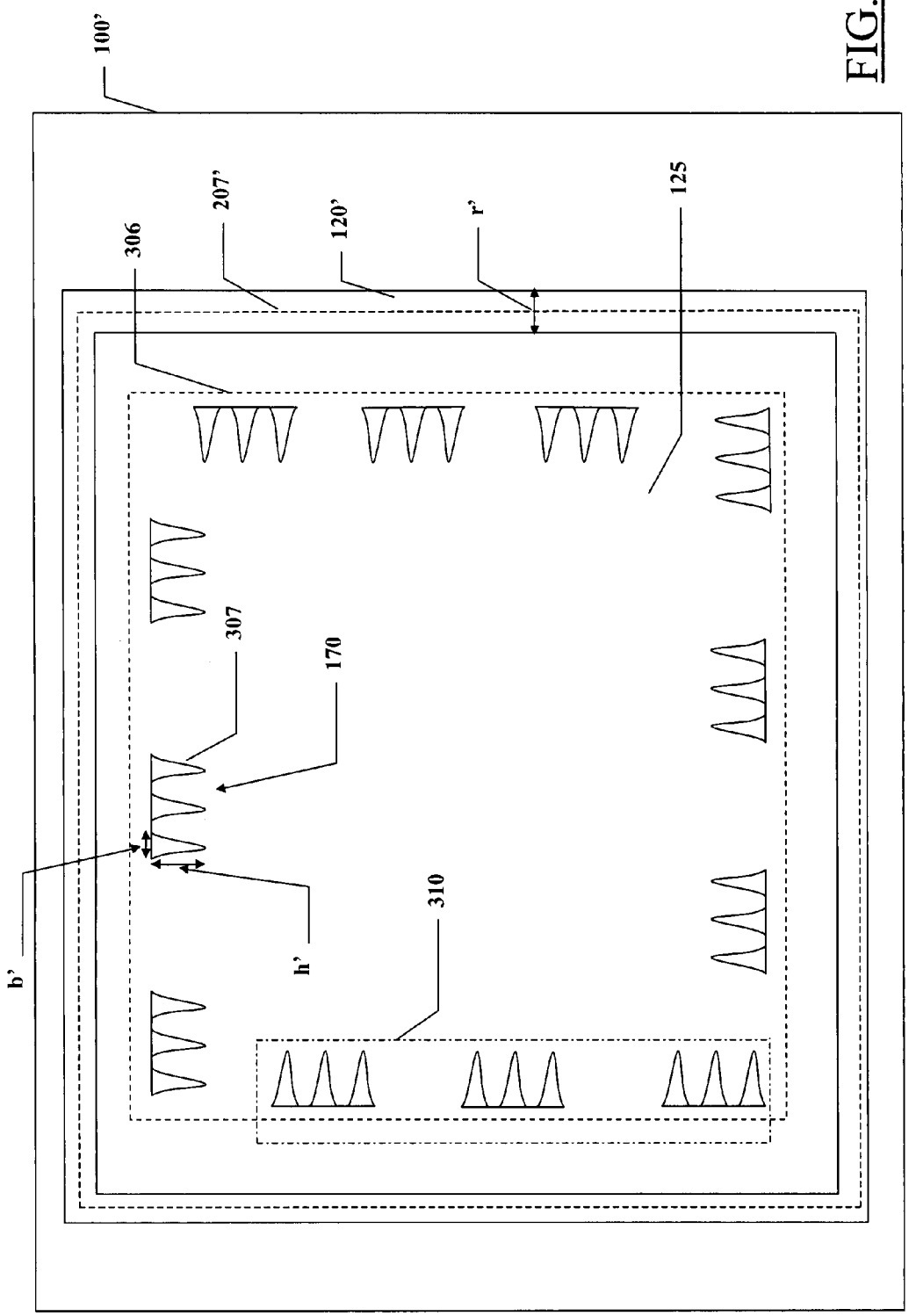
FIG. 3 shows a partially cut-away elevation view of the SOI device according to a further embodiment of the present invention.

Embodiments of layouts of the device 100 well suited to achieve the desired result are shown in FIGS. 2 and 3.

Referring in particular to FIG. 2, a partially cut-away elevation view of the electronic device 100 according to an embodiment of the present invention is shown. As can be noted, the trench 120 defines the active region 125 within the device 100. The contact terminal 150 within the active region 125 surrounds the openings of the insulating layer (not shown in the Figure).

The trench 120 includes a main portion 205 in the form of a ring; the portion 205 has a uniform width (along a longitudinal line 207 thereof, consisting of a circle in the example at issue). Multiple elongated elements 210 (such as 5-20 in number) project from the ring portion 205 inwards the active region 125 (i.e., from an inner edge thereof); advantageously, each element 210 tapers towards the inside of the active region 125 (for example, being in the form of a cusp). The tapered element 210 has a base width b, which is lower than a width r of the ring portion 205; at the same time, the base width b of the tapered element 210 is smaller than its height h. For example, the ratio of the base width b with the ring width r and the height h may be at most 0.9; and, in another example, at most 0.7 (such as 0.5). In an embodiment, all the tapered elements 210 extend in the direction of a center of symmetry (or focus) 215 of the ring portion 205 (in other words, their symmetry axes—not shown in the figure—pass through the focus 215). In addition, the tapered elements 210 may be arranged uniformly along the ring portion 205, i.e., the distance between each pair of adjacent tapered elements 210 along the circle 207 is always the same.

The proposed layout has been found to provide good results in terms of the performance of the front-rear contact. Particularly, the different features relating to the shape of the tapered elements 210, i.e., their projecting inwards, their tapering towards the inside, and the proposed dimensioning (b/r<1 and b/h<1) contribute to increase the conductivity (either alone or in combination to each other). Moreover, the direction of the tapered elements 210 towards the focus 215 and their uniform distribution concentrate this result in the area around the focus 215 (wherein the openings in the insulating layers are formed).

Moving to FIG. 3, a partially cut-away elevation view of the same electronic device according to a further embodiment of the present invention is shown (the electronic device and its components of this embodiment will be differentiated by means of a prime notation). In this case, the device 100' has the (outer) insulating trench 120' with a uniform width (along a longitudinal line 207' thereof, consisting of a square in the example at issue); however, the auxiliary insulating trenches 170 are now provided within the active region 125.

In particular, the (inner) trenches 170 have a section across each plane parallel to the front surface of the device 100' that extends along a line 306 concentric with the square 207' (i.e., consisting of a smaller square).

Each inner trench 170 may be formed by multiple tapered elements 307 (three in the example at issue) tapering towards the inside of the active region 125 (for example, being in the form of cusps). Each tapered element 307 has a base width b', which is substantially equal to a width r' of the outer trench 120' (so that the trenches 120' and 170 have the same depth); at the same time, the base width b' of the tapered element 307 is smaller than its height h'. For example, the ratio of the base width b' with the trench width r' may range from 0.8 to 1.2, and may range from 0.9 to 1.1 (around the target value of 1); moreover, the ratio of the base width b' with the height h' may be at most 0.9; for example, this ratio may be at most 0.8, and may be at most 0.7 (such as 0.5). In an embodiment, all the tapered elements 307 extend in a direction perpendicular to the corresponding side of the square 306.

In addition, the inner trenches 170 are grouped in a plurality of sets 310. The sets 310 may be uniformly arranged along the square 306. In particular, the sets 310 of parallel sides of the square 306 may be staggered to each other. In the example at issue, this result is achieved by shifting counter clockwise the sets 310 along the square 306; in this way, in the pair of horizontal sides of the square 306 the set 310 of the upper side starts from the left and the set 310 of the lower side starts from the right, whereas in the pair of vertical sides the set 310 of the right-hand side starts from the top and the set 310 of the left-hand side starts from the bottom. In each set 310, the tapered elements 306 may be in turn uniformly spaced to each other.

This layout too provides good results in terms of the performance of the front-rear contact. As above, the different features relating to the shape of the inner trenches 170, i.e., their elements tapering towards the inside, and the proposed dimensioning (b'/r'=1 and b'/h'<1) contribute to increase the conductivity (either alone or in combination to each other). Moreover, the direction of the tapered elements 307 perpendicular to the sides of the square 306, the arrangement of the inner trenches 170 along the square 306, the uniform distribution of the sets 310, their staggering, and the uniform distribution of the tapered elements 307 in each set 310 may scatter this result throughout the whole active region 125

Referring now to FIGS. 4A through 4I, a process for manufacturing the electronic device 100 (of both the embodiments described above) will be explained in detail.

Figure 4A:
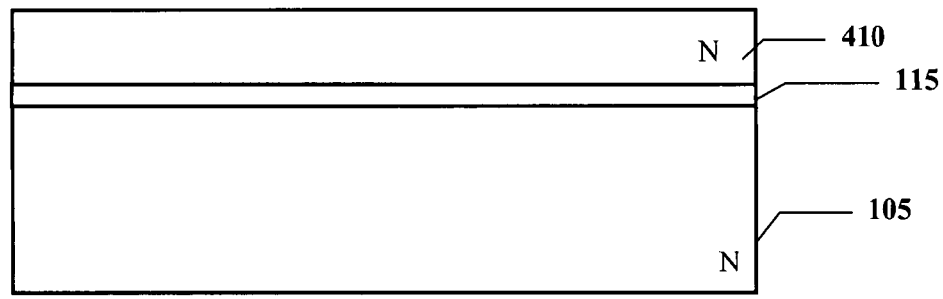
FIGS. 4A through 4I are cross-section views illustrating the main phases of the manufacturing process of a SOI device, according to an embodiment of the present invention.

Considering in particular FIG. 4A, the starting material is an SOI substrate. The SOI substrate includes the (semiconductor) substrate 105. For example, the substrate 105 is of the N type of conductivity, with a resistivity ranging from 1 $\Omega$cm to 50 $\Omega$cm, such as 40 $\Omega$cm. Moreover, the SOI substrate includes a semiconductor starting layer 410 of the N-type, which is separated from the (semiconductor) substrate 105 by the insulating layer 115. For example, the insulating layer 115 has a thickness ranging from 0.1 $\mu$m to 2 $\mu$m, and, for example from 0.5 $\mu$m to 1.5 $\mu$m (such as 1 $\mu$m), whereas the starting layer 410 may have a thickness ranging from 50 nm to 1500 nm.

Figure 4B:
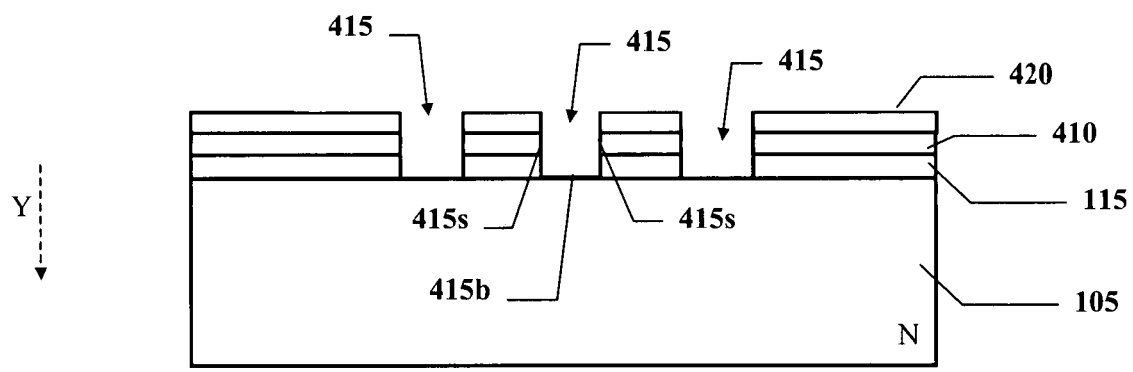

Moving to FIG. 4B, multiple trenches 415 (such as 4-10 trenches) are formed by selectively etching the layers 410 and 115. In order to form the trenches 415, a photoresist mask 420 is provided on top of the starting layer 410, so as to leave exposed areas thereof where the openings in the insulating layer 115 are desired. Using suitable etching techniques, the layers 410 and 115 are selectively removed, down to the substrate 105.

In particular, the etching of the layers 410 and 115 is performed by two processes, which are substantially anisotropic along a vertical direction Y (meaning that the layers 410 and 115 are only vertically etched). In detail, the first etching selectively removes the areas of the starting layer 410 which are left exposed by the mask 420. Then, the second etching process selectively removes the insulating layer 115 down to the substrate 105.

In such a way, each trench 415 clears a corresponding portion of the substrate 105 (defining a bottom wall 415$b$) and corresponding internal portions of the starting layer 410 and of the insulating layers 115 (defining side walls 415$s$).

Figure 4C:
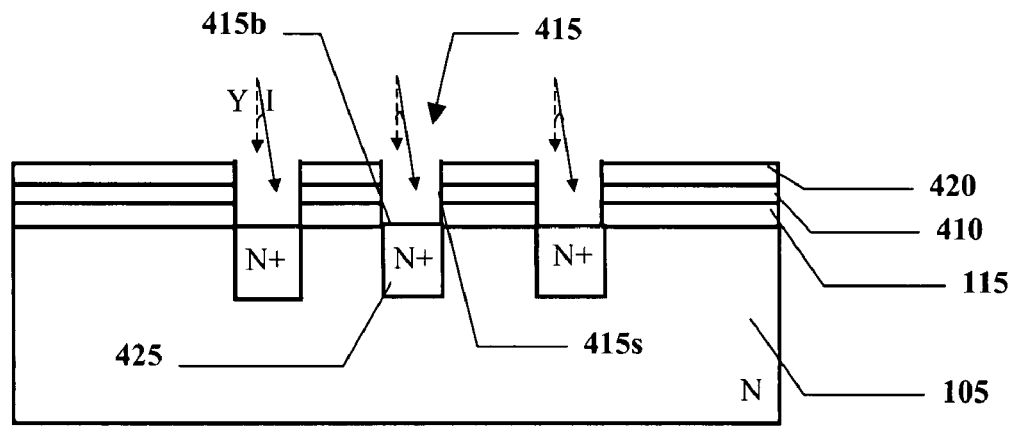

As shown in FIG. 4C, a dopant implantation is performed in order to form (within the substrate 105 and the starting layer 410) more heavily doped internal regions 425 (only shown for the substrate 105 in the figure). Such implantation uses the mask 420 in order to have the internal regions 425 in areas corresponding to the trenches 415.

For example, in order to form N+ internal regions 425, Arsenic (As) dopant ions may be used; the dopant dose may range from $10^{12}$ ions/cm$^2$ to $10^{16}$ ions/cm$^2$. Alternatively, Antimony (Sb) or Phosphorus (P) dopant ions may be used.

The dopant implantation is performed by at least two implantation processes along different directions, in order to cause the dopant ions to penetrate beneath the insulating layer 115 and within the starting layer 410. For this purpose, each implantation process involves the use of a beam of dopant ions propagating along a direction I having a corresponding tilt a with respect to the vertical direction Y. The tilt a may range from 2° to 45°, and may more narrowly range from 5° to 20° (such as α=7°). Two implantation processes are performed along directions that are symmetric with respect to the vertical direction Y (so as to reach opposed regions). For example, during a first implantation process, the wafer may be inclined with respect to a direction of the dopant ions beam at an angle α=7°, whereas during a second implantation process the wafer may be inclined at the opposite angle α=−7°.

Figure 4D:
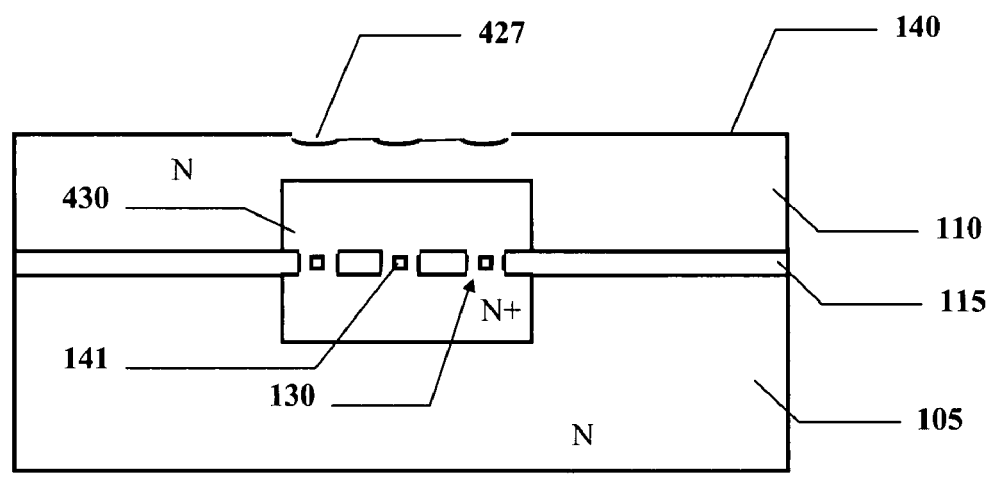

Referring to FIG. 4D, an epitaxial growing process is then carried out (for example, by means of Vapor-Phase Epitaxy). The epitaxial growing process is performed in a room comprising a silicon compound (for example, silicon tetrachloride $SiCl_4$ or trichlorosilane $SiHCl_3$) at high temperature (for example, ranging from 1000° C. to 1200° C.). The epitaxial growing process applied to the starting layer 410 (see FIG. 4B) results in the generation of the active layer 110 of the N-type (for example, with a thickness of about 1 μm-10 μm). Concurrently, the same process applied to the walls 415b and 415s completely or partially fills the trenches 415, leaving in the second case the vacant regions 141 without any semiconductor material within the resulting openings 130. This is due both to the geometry of the trenches 415 and to the different growing rates of the process over the cleared portions of the substrate 105, of the insulating layer 115 and of the starting layer 410. As a result, the obtained structure may not be planar, with recesses 427 corresponding to the openings 130 at the front surface 140.

During the epitaxial growing process, the dopant ions of the internal regions 425 (see FIG. 4C) diffuse thereby forming a contact region 430 of the N+ type. As can be noted, the contact region 430 encloses all the openings 130 so as to contact the substrate 105 with the active layer 110.

The contact region 430 is more conductive than the semiconductor material surrounding it. First of all, this is due to the high dopant concentration created by the above-mentioned diffusion. Moreover, the edges formed in the insulating layer 115 (during the etching of the trenches) generate crystalline defects in the semiconductor material adjacent thereto, thereby increasing its conductivity.

Figure 4E:
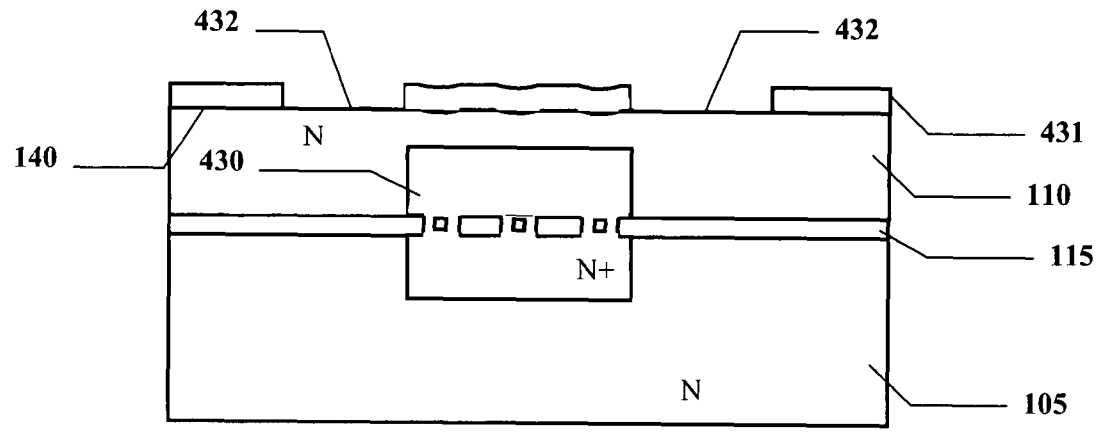

Moving to FIG. 4E, a field oxide layer 431 is formed (for example, by means of a selective or LOCOS thermal growth) in order to cover the front surface 140 except for a portion thereof where active areas 432 of the desired device will be defined. For this purpose, a silicon nitride (such as $Si_3N_4$) mask (not shown in Figure) is provided on top of the active layer 110, so as to leave exposed areas thereof where the field oxide layer 431 is desired.

Figure 4F:
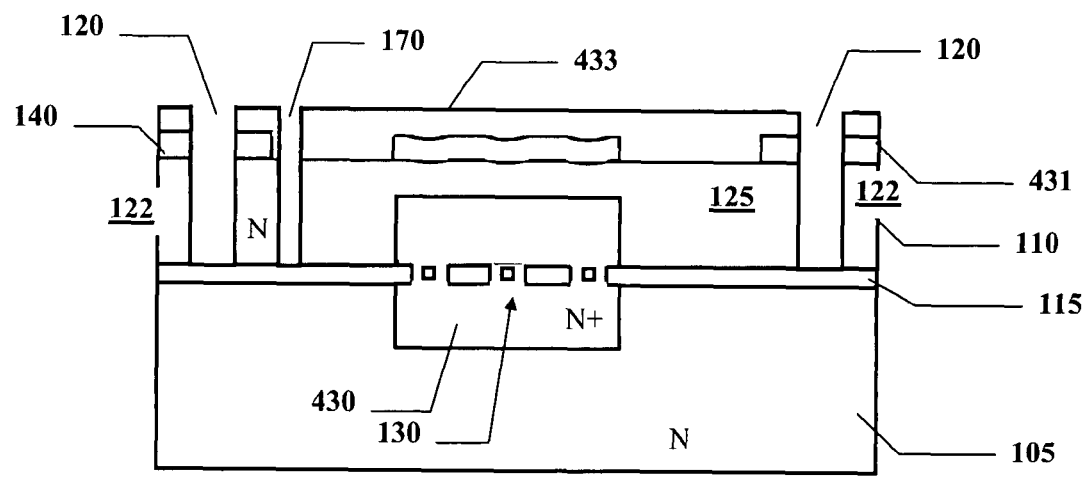
Figure 4G:
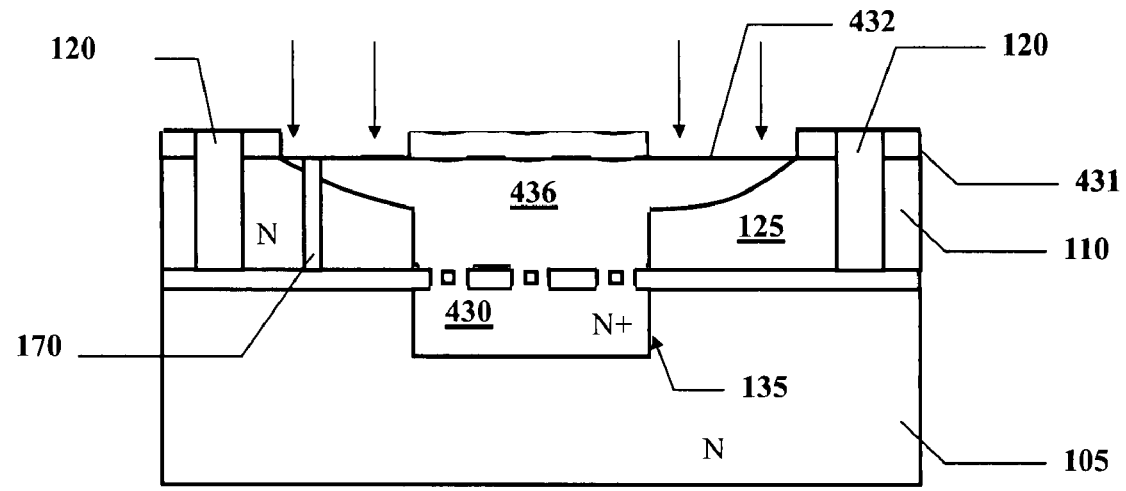

As shown in FIG. 4F, the insulating trench 120 (possibly with its tapered elements) and/or the auxiliary trenches 170 are then formed. For example the insulating trench 120 and/or the auxiliary trenches 170 are of the DTI type. For this purpose, a further mask 433 is provided on top of the of the field oxide layer 431 and of the active layer 110 so as to leave exposed areas thereof where the trenches 120, 170 are desired.

Using suitable etching techniques, the active layer 110 and the field oxide layer 431 are selectively removed, down to the insulating layer 115. As a result, the insulating trenches 120 partition the active layer 110 into the insulated regions 122, which will be used to integrate the desired electronic components. Moreover, the insulating trench 120 around the opening 130 defines the (insulated) active region 125, which is used to contact the substrate 110 from the front surface 140 so as to provide the desired front-rear contact through the insulating layer 115.

For this purpose, the mask 433 is stripped away. Continuing to FIG. 4G, the insulating trench 120 and/or the auxiliary trenches 170 are filled with dielectric material, such as silicon-dioxide. In particular, an oxidation process (for example, a thermal growing process) may be performed in order to form an oxide layer on the portions of the active layer 110 which are laterally cleared by the trenches 120 and/or 170. Such oxide layer generates a mechanical stress on the active layer 110 surrounding the narrowest portions of the trenches 120, 170 (thanks to an increase of volume thereof occurring during the oxidation process) so as to obtain the above-mentioned crystalline defects improving the conductivity of the active region 125. Then, a further dielectric material, such as silicon-dioxide is formed (for example, by means CVD oxide deposition).

Thereafter, an implantation process is performed (through the active areas 432 of the active layer 110) in order to obtain a heavily doped region within the active region 125; in the example at issue, As or P dopant ions are used. Then, the dopant ions diffuse so forming an N+ contact region 436, which reaches the (buried) contact region 430 so forming the region 135.

Figure 4H:
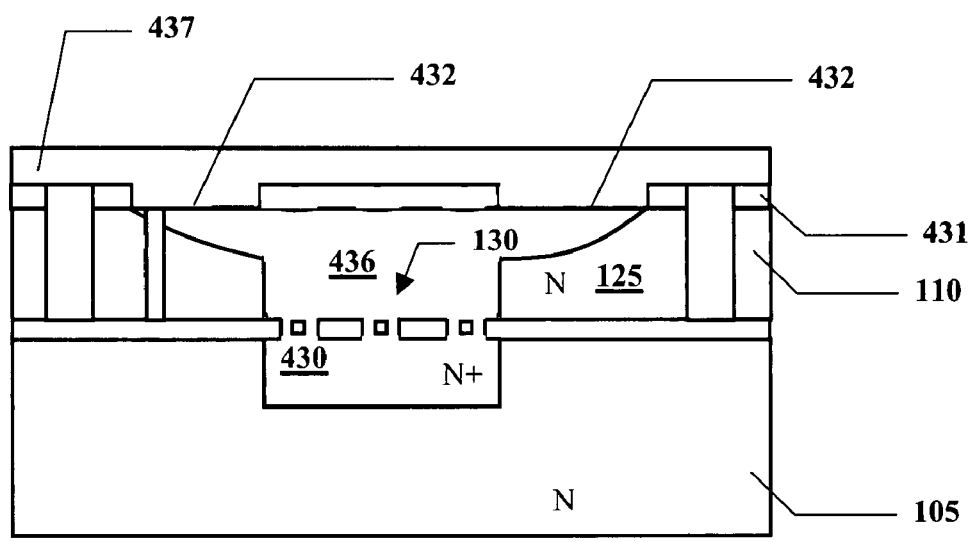

Moving to FIG. 4H, a dielectric layer 437 (for example, doped silicon oxide) is deposited on top of the field oxide layer 431 and on the active areas 432, for example, by means of a CVD process. Then, the dielectric layer 437 is planarized, typically using the CMP (Chemical Mechanical Polishing) technique, so as to flush the recesses corresponding to the openings 130 formed beforehand.

Figure 4I:
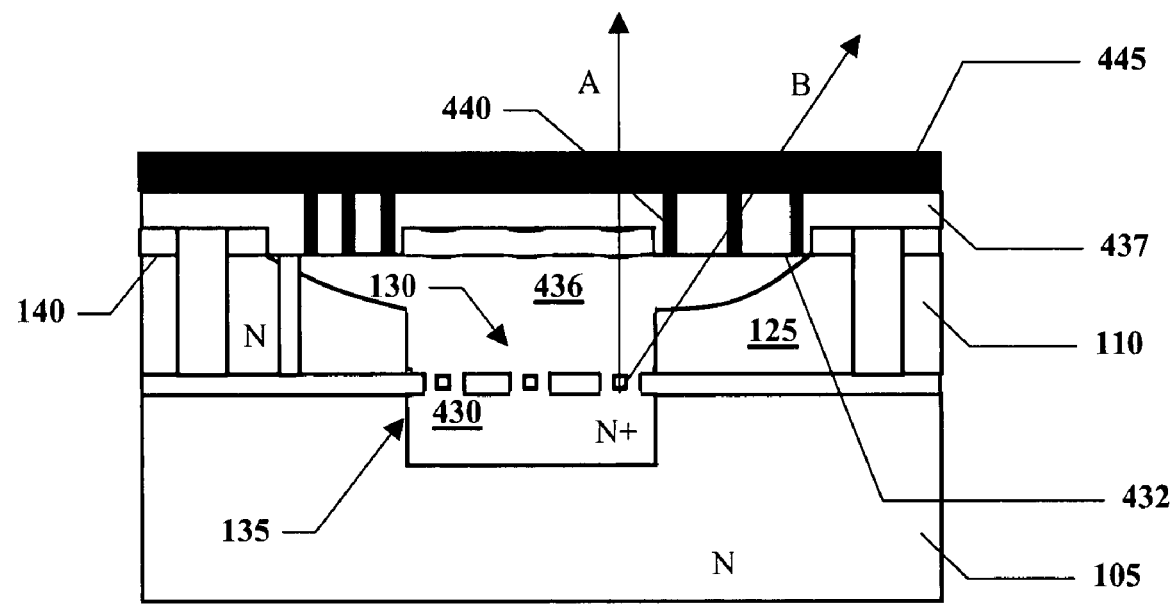

As shown in FIG. 4I, a plurality of contact windows 440 are etched in the dielectric layer 437 in correspondence of the active areas 432 (so as to reach the contact region 436). Each contact window 440 surrounds the contact region 430 in plant view. Particularly, each point of the contact window 440 is spaced apart from an axis A of each opening 130 (parallel to the vertical direction) in order to prevent any disturbances due to the corresponding recesses on the front surface 140. A line B connecting each point of the contact window 440 (at the corresponding active area 432 on the front surface 140) with the edge of the opening 130 closest to the contact window 440 (on its bottom wall at an upper surface of the substrate 110) forms an angle β, which may be higher than 60°, for example at least equal to 61°-85°, and more narrowly at least equal to 64°-82° (such as at least equal to 65°). In other words, this condition is satisfied by the internal edge of the contact window 440, with respect to the opening 130 that is closest to the contact window 440 (being the same angle higher otherwise).

Afterwards, a metallization layer 445 (for example, Al or Ti/TiN plus a W-plug and an Al layer) is deposited on top of the wafer, thereby filling the contact windows 440 and covering the exposed surface of the dielectric layer 437. The metallization layer 445 is then shaped to define a pad, which allows contacting the substrate 105 through the insulating layer 115. In particular, the contact is obtained through the contact windows 440 (with the higher the number of contact windows 440, the higher the conductivity thereof), the contact region 436 and the contact region 430.

The process described-above may further reduce the size of the front-rear contact; moreover, it may further improve its electrical properties (and specially the conductivity).

Several factors contribute to the desired characteristics. First of all, a contribution is given by the contact region 135;

particularly, its beneficial effect is emphasized by the fact that the contact region 135 surrounds the openings 130 formed in the insulating layer 115. This is achieved thanks to the corresponding implantation processes that are inclined as indicated above(with the best result that is provided by the proposed tilt).

Moreover, the choice of displacing the contact windows 440 with respect to the axis of the openings 130 creates a preferential path for the electrical charge along which the resistance of the semiconductor material is further reduced (with the best results that are provided by the proposed angles).

Advantages of the proposed solution are confirmed by experiment results.

Figure 5A:
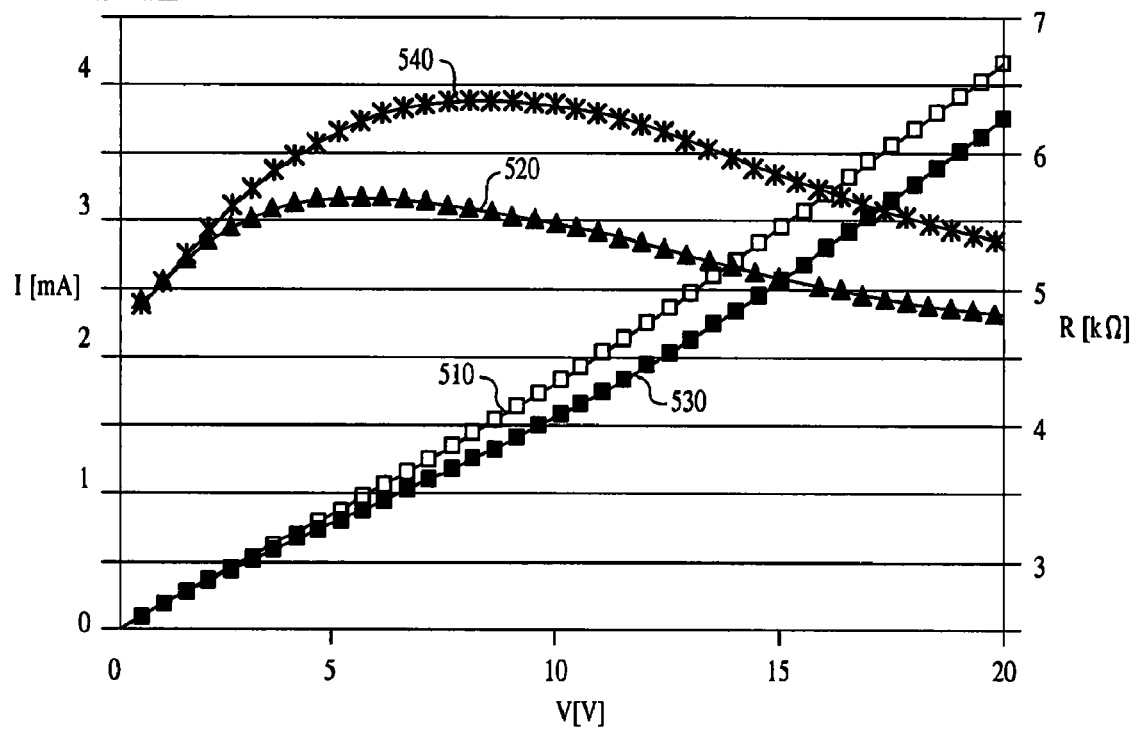
FIGS. 5A and 5B show exemplificative diagrams relating to electrical operative parameters of the SOI device according to an embodiment of the present invention.
Figure 5B:
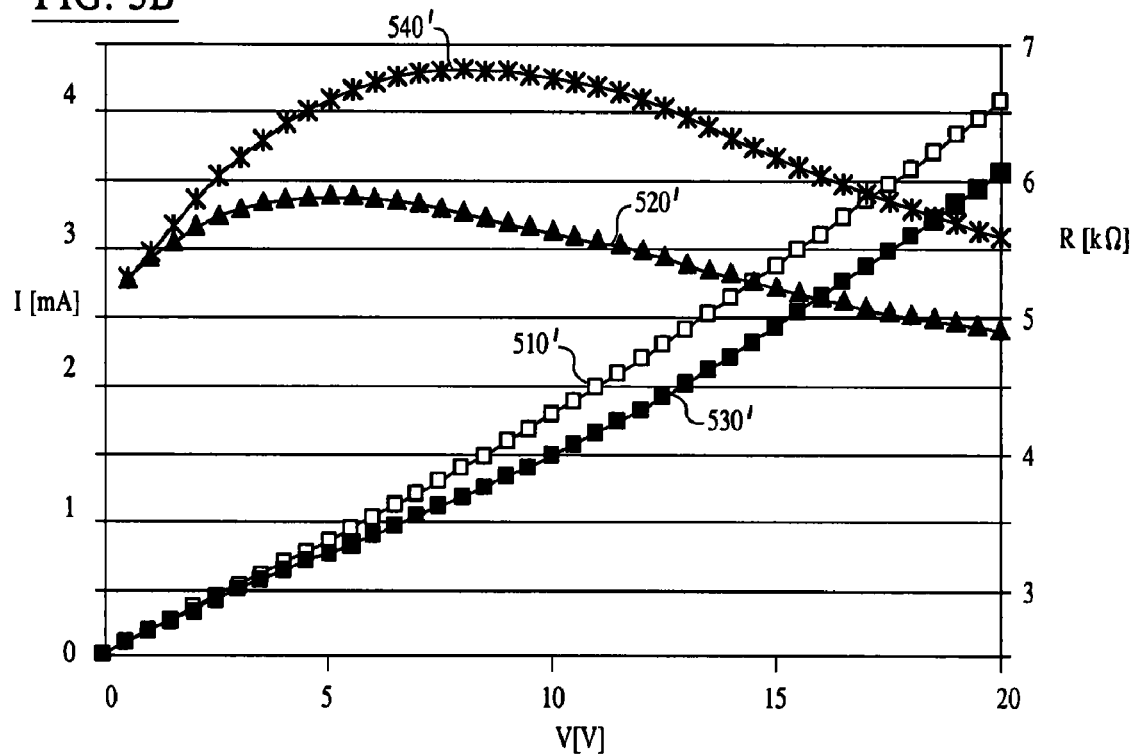

Particularly, FIGS. 5A and 5B show a set of working characteristics of the electronic device according to the embodiment of the present invention illustrated in FIG. 2 when compared to electronic devices with the outer trench lacking any tapered elements. In detail, the working characteristics of the FIG. 5A relate to electrical parameters of the semiconductor material adjacent to the openings through the insulating layer, whereas the working characteristics of the FIG. 5B relate to the same electrical parameters of the semiconductor material far from such openings. In particular, the diagrams of both the FIGS. 5A and 5B have a current I[mA] on a left axis of ordinates, a resistance R[kΩ] on a right axis of ordinates and a biasing voltage V[V] on an axis of abscissas.

For this purpose, two adjacent front-rear contacts are formed in the same electronic device (both of them connected to the substrate of the electronic device). Biasing voltages V ranging from 0V to 20V are then applied between the two front-rear contacts, and the corresponding currents I are measured (with the resistance R that is calculated as V/I).

Referring to FIG. 5A, working characteristics 510 (representing the current) and 520 (representing the resistance) are obtained when the front-rear contact is insulated by means of a trench including tapered elements. The remaining working characteristics 530 (representing the current) and 540 (representing the resistance) are obtained for non-optimized electronic devices having a uniform insulating trench (i.e., when the active region is perfectly cylindrical). In both cases, the measures relate to the semiconductor material adjacent to the openings through the insulating layer.

As it can be noted, the working characteristic 520 is below the working characteristic 540 (meaning that the resistance R of the front-rear contact according to a proposed embodiment of the present invention is lower). For example, when the biasing voltage V is equal to 10V the resistance R is reduced by about one fourth (from 5.4 kΩ to 6.8 kΩ).

Moving now to FIG. 5B, working characteristics 510' (representing the current) and 520' (representing the resistance) are likewise obtained when the front-rear contact is insulated by means of a trench including tapered elements. The remaining working characteristics 530' (representing the current) and 540' (representing the resistance) are obtained for non-optimized electronic devices having a uniform insulating trench. However, the measures now relate to the semiconductor material far from the openings through the insulating layer.

Also in this case, the working characteristic 520' is below the working characteristic 540' (meaning that the resistance R of the front-rear contact according to the proposed embodiment of the present invention is lower).

The diagrams of the two FIGS. 5A, 5B also confirm that the increment of the conductivity is non-uniform within the active region (i.e., it is higher in the region around the openings than far from them). For example, when the biasing voltage V is equal to 10V the resistance R of the semiconductor material surrounding the openings (see FIG. 5A) is lower than the one of the semiconductor material far from such openings (see FIG. 5B), such as 5.4 kΩ and 5.6 kΩ, respectively.

Figure 6:
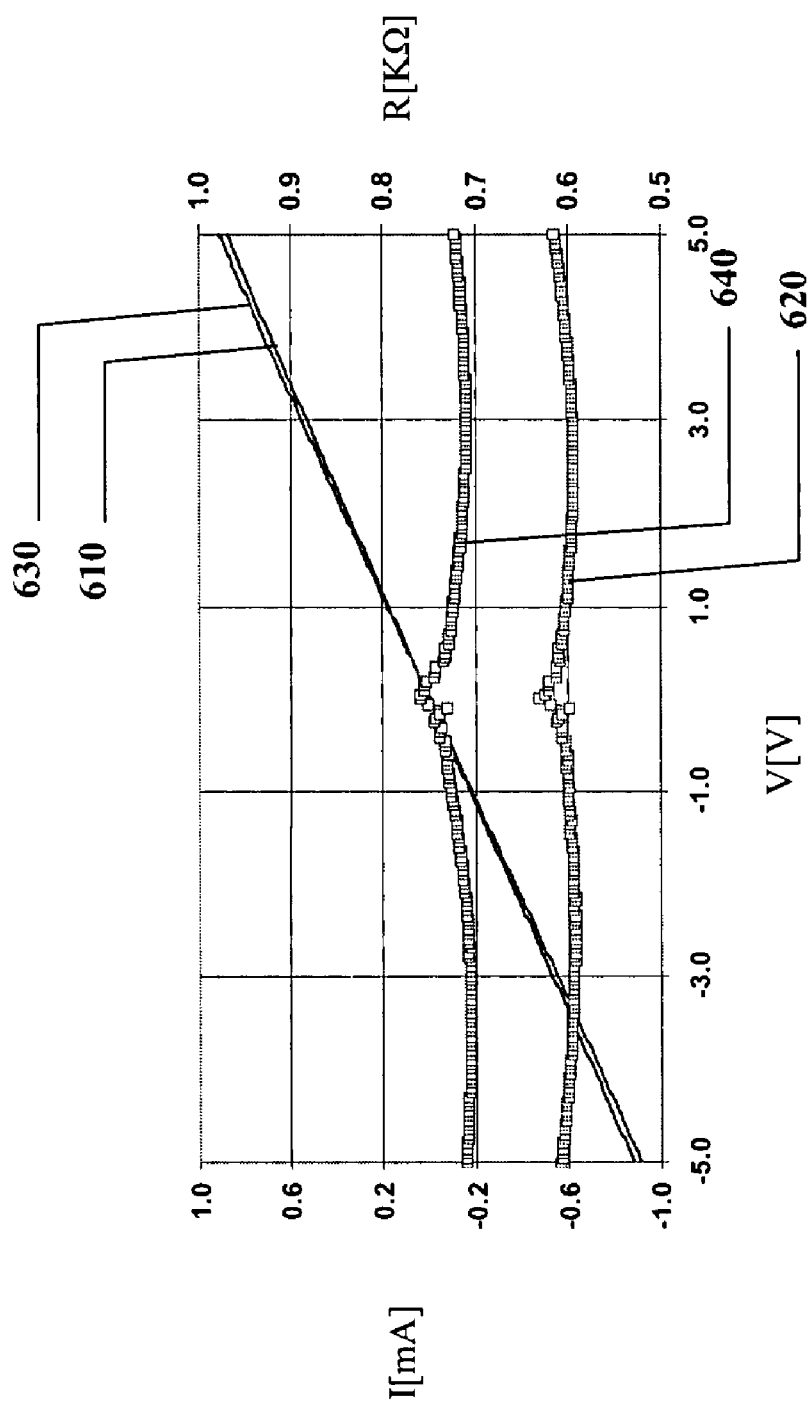
FIGS. 6 shows further exemplificative diagrams relating to electrical operative parameters of the SOI device according to a further embodiment of the present invention.

Referring to FIG. 6, a similar diagram shows a set of working characteristics of the electronic device according to the embodiment of the present invention illustrated in FIG. 3 when compared to electronic devices without any additional inner trenches.

As can be seen, working characteristics 610 (representing the current) and 620 (representing the resistance) are obtained when the inner trenches are added. The remaining working characteristics 630 (representing the current) and 640 (representing the resistance) are obtained for non-optimized electronic devices only with the (uniform) outer trench.

Also in this case, the working characteristic 620 is below the working characteristic 640 (meaning that the resistance R of the front-rear contact is lower).

Referring now to FIGS. 7A through 7E, according to a further embodiment of the invention, a process for manufacturing a front-rear contact in a standard device (integrated in a chip having a silicon substrate) is provided.

Figure 7A:
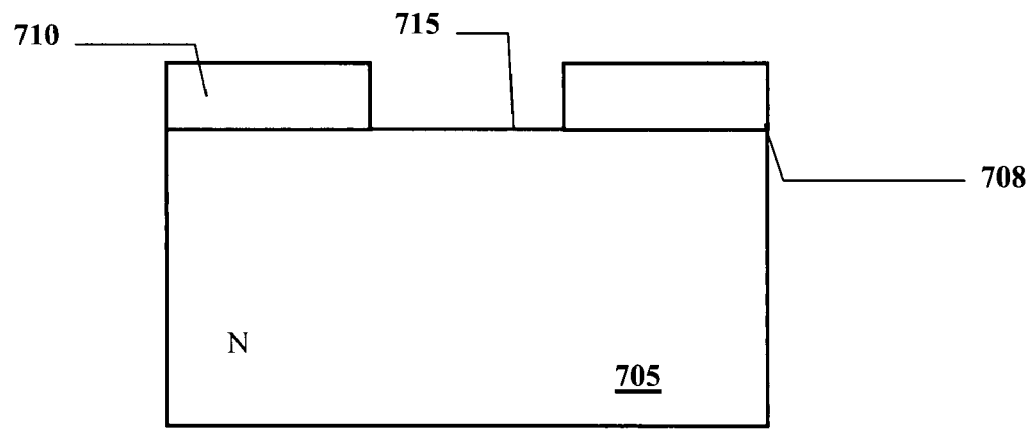
FIGS. 7A through 7E are cross-section views illustrating the main phases of the manufacturing process of an electronic device of the standard type, according to a further embodiment of the present invention.

Considering in particular FIG. 7A, the starting material is a wafer consisting of a silicon substrate 705 (for example, of the N type of conductivity).

A field oxide layer 710 is formed (for example, by means of the selective or LOCOS thermal growth) in order to cover a front surface 708 of the substrate 705 except for a front-contact area 715 (when the front-rear contact will be formed). For this purpose, a silicon nitride (such as $Si_3N_4$) mask (not shown in Figure) is provided on top of the silicon substrate 705, so as to leave exposed areas thereof where the field oxide layer 710 is desired.

Figure 7B:
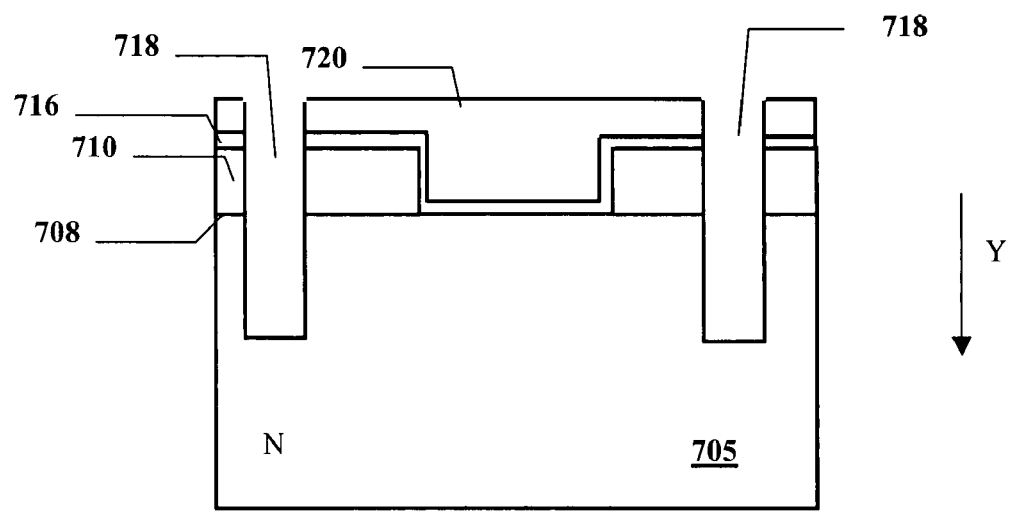

Moving to FIG. 7B, a silicon nitride layer 716 is formed (such as deposited) on top of the silicon substrate 705 and the field oxide layer 710. Then, an insulating trench 718 is formed, by selectively etching the layers 705, 710 and 716. In order to form the trench 718, a photoresist mask 720 is provided on top of the silicon nitride layer 716 so as to leave exposed areas thereof where the insulating trench 718 is desired. Using suitable etching techniques, the layers 705, 710 and 716 are selectively removed.

In particular, the etching of the layers 705, 710 and 716 is performed by two processes, which are substantially anisotropic along the vertical direction Y. In detail, the first etching selectively removes the areas of the silicon nitride 716 and the field oxide layer 710 which are left exposed by the mask 720. Then, the second etching process selectively removes a desired portion of the substrate 705.

In this case as well, the trench 718 has a non-uniform section across each plane parallel to the front surface 708 (such as with projecting portions having the above described layout).

Figure 7C:
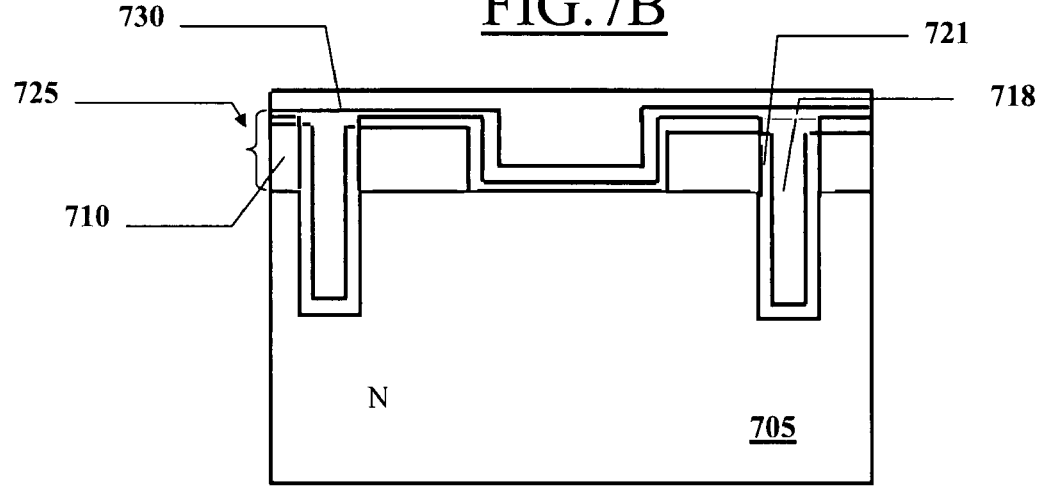

As shown in FIG. 7C, the mask 720 is stripped and the trench 718 is subjected to an oxidation process (such as a thermal growing process) in order to form an insulating layer 721 on the walls of the trench 718 (generating the crystalline defects improving the conductivity of the front-rear contact).

Then, the trench 718 is filled with one or more layers of dielectric material (for example, by means of a Chemical Vapor Deposition process). As a result, an insulating layer 725 is formed (being thicker in areas corresponding to the field oxide layer 710).

Then, a premetal layer 730 (for example, doped silicon oxide) is deposited on top of the insulating layer 725 (for example, by means of a CVD process), so as to obtain a planar surface.

Figure 7D:
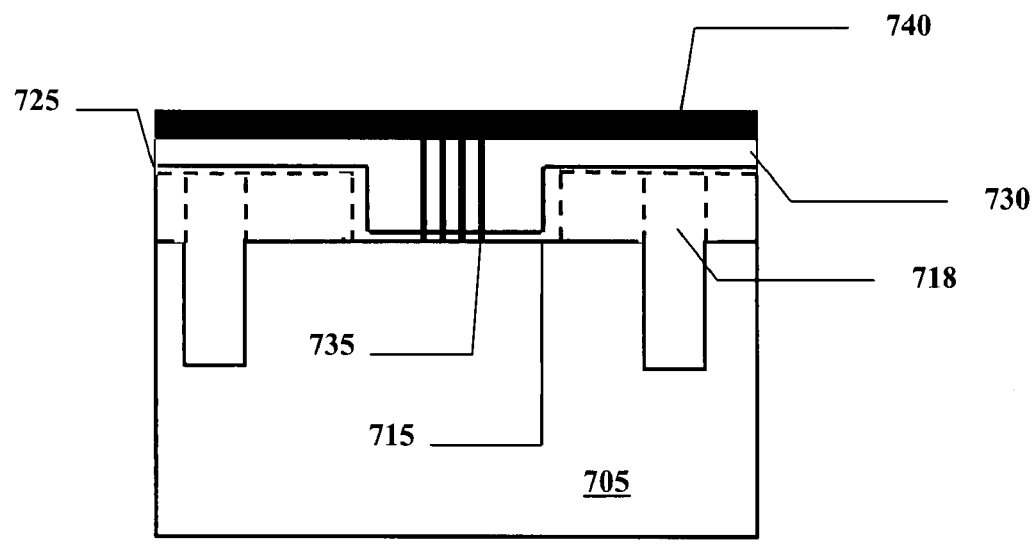

Thereafter, as shown in FIG. 7D, front contact windows 735 are opened in the front-contact area 715, by selectively etching the insulating layer 725 and the premetal layer 730. For this purpose, a further photoresist mask (not shown in Figure) is provided on top of the premetal layer 730, so as to leave exposed areas thereof where the front contact windows 735 are desired. Using suitable etching techniques, the insulating layer 725 and the premetal layer 730 are selectively removed, down to the front contact area 715.

Afterwards, a metallization layer 740 (for example, Al or Ti/TiN plus a W-plug and an Al layer) is deposited on top of the wafer, so filling the front contact windows 735 and covering the exposed surface of the premetal layer 730. The metallization layer 730 is now shaped for defining a front pad.

Figure 7E:
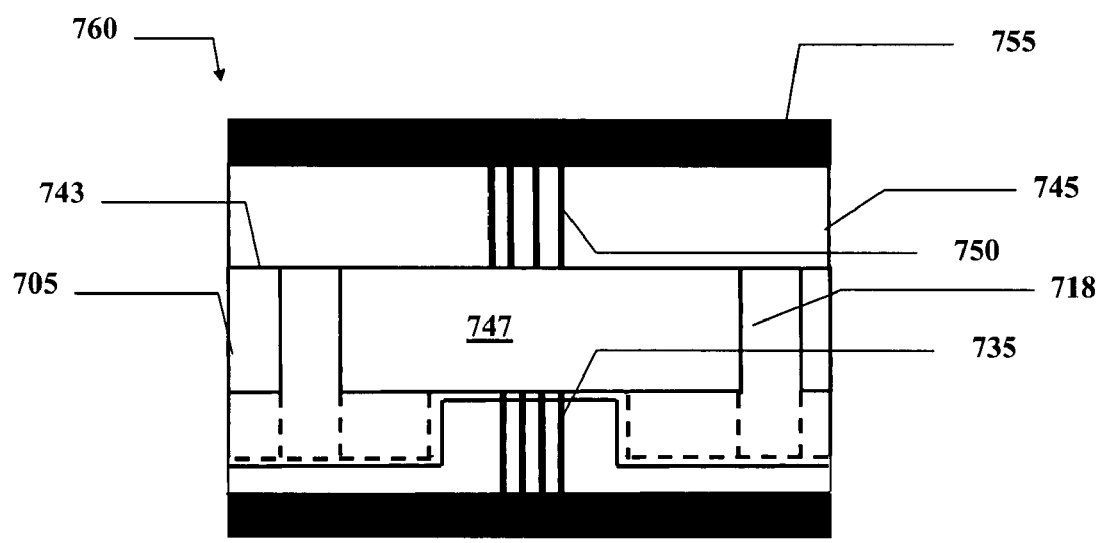

As shown in FIG. 7E, the substrate 705 is overturned and grinded so as to obtain a rear surface 743 which is reached by the insulating trench 718. In such a way, an active region 747 of the substrate 705 is surrounded and insulated by the trench 718. A further premetal layer 745 is deposited on the rear surface 743 (for example, by means of a CVD process).

As above, rear contact windows 750 (opposite the front contact windows 735) are opened, by selectively etching the premetal layer 745 down to the substrate 705.

Afterwards, a similar metallization layer 755 is deposited onto the wafer, so filling the rear contact windows 750 and covering the exposed surface of the premetal layer 745.

The metallization layer 755 is now shaped for defining a rear pad. In this way a final electronic device 760 is obtained. The device 760 includes the desired front-rear contact between the front pad and the rear pad (through the front contact windows 735, the active region 747, and the rear contact windows 750).

The trench 718 has the same structure illustrated above (so that its detailed description is omitted for sake of brevity). In this case as well, the trench 718 generates defects in the active region 747, which improve the electrical properties (and specially the conductivity) of the front-rear contact across the chip.

Naturally, in order to satisfy local and specific requirements, a person skilled in the art may apply to the one or more solutions described above many modifications and alterations. Particularly, although the present invention has been described with a certain degree of particularity with reference to one or more embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the device has an equivalent structure (such as with whatever number of layers, even having different thickness), or if it is made with other materials; moreover, although in the preceding description reference has been made to a semiconductor substrate and a starting layer of N-type, the conductivity types of these layers may be reversed (i.e., of P-type). In any case, the numerical examples described above are merely illustrative and must not be interpreted in a limitative manner.

Alternatively, the front-rear contact may be insulated by means of a trench extending along any longitudinal closed line (or even open when arranged at a corner of the device); for example, the longitudinal line may be a square for the non-uniform trench, a circle for the uniform trench (with the inner trenches), a rectangular, an hexagon and so on in both cases.

It is emphasized that the features of the different embodiments of the invention described above can be mixed in whatever combination. For example, although the embodiment based on the non-uniform trench is more indicated for the standard devices nothing prevents its application to the SOI devices; vice-versa, although the embodiment based on the inner trenches is more indicated for the SOI devices nothing prevents its application to the standard devices. Moreover, in the embodiment based on the non-uniform trench the tapered elements may be arranged in groups, which are distributed as proposed above along a squared longitudinal line of the trench; alternatively, in the embodiment based on the inner trenches they may be distributed uniformly along a circular longitudinal line.

Similar considerations apply if the SOI device and/or the standard device have a different structure (for example, without any vacant region within the openings formed in the insulating layer for the SOI device or with a more doped contact region in the active region for the standard device). In any case, the solution according to one or more embodiments of the present invention lends itself to be applied to any other type of front-rear contact (even the ones known in the art based on the trench covered by the conformal conductive layer); more generally, the proposed solution(s) may be implemented in whatever electronic device that is integrated in a generic chip (wherein one or more front-rear contacts are required across the whole chip or one or more stacked layers thereof even internal to the chip).

In a different embodiment of the invention based on the SOI device, the front-rear contact may be formed with another number of openings across the insulating layer (down to a single one); moreover, the contact region surrounding the openings may also be omitted in a simplified implementation.

Alternatively, it is also possible to form each electrical contact at a different angle with respect to the axis of each opening; however, nothing prevents having some electrical contact along the axis of a corresponding opening.

Similar considerations apply if the elements projecting from the outer trench and/or the inner trenches are in a different number.

In any case, the use of elements projecting from the outer trench in the opposite direction (i.e., outwards) is within the scope of the invention.

Moreover, nothing prevents arranging the inner trenches according to any other pattern (for example, in a matrix), or making them less shallow or even buried in the active layer.

In any case, tapered elements having different shape may be used; however, the use of elements (either projecting from the outer trench or for the inner trenches) with a uniform width is contemplated.

The proposed dimensioning of the tapered elements must not be interpreted in a limitative manner; for example, the use of larger tapered elements is within the scope of the present invention.

Although in the preceding description reference has been made to tapered elements directed towards the center of the active region, it is also possible to tilt them (so obtaining a more uniform increment of the conductivity within the active region).

Similar considerations apply if the tapered elements are tilted with respect to the axes of the corresponding sides of the longitudinal line of the outer trench and/or of the inner trenches.

Moreover, nothing prevents arranging the tapered elements and/or their sets along the corresponding longitudinal line non-uniformly; this may apply to the sets only, to the tapered elements within each set only, or to both of them.

In addition, an implementation wherein the tapered elements are not staggered is feasible.

It is emphasized that the described process is not to be interpreted in a limitative manner. Particularly, it is possible to use equivalent steps, to remove some steps being not essential, or to add further optional steps; moreover, the masks used during the process can be different in number and in type.

For example, the openings and their filling may be obtained in a different way.

In addition, the implantation process before the growing process is not strictly necessary and it may be omitted in a simplified implementation (even if the performance of the front-rear contact would be reduced).

In any case, different beams of dopant ions can be used during the implantation process (even with a different number of them, down to a single one). Moreover, nothing prevents using beams, which form a different angle with the axis of each trench (even equal to zero).

It should be readily apparent that the proposed devices may be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages form. Moreover, the device may be integrated with other circuits in the same chip, or it may be mounted in intermediate products (such as mother boards). In any case, the integrated circuit is suitable to be used in complex systems (such as computers).

The invention claimed is:

1. An electronic device integrated in a chip having a front surface and a rear surface opposite the front surface, the device including:
   an insulating trench laterally insulating an active region of the chip, the insulating trench having a section across each plane parallel to the front surface and the insulating trench extending along a longitudinal line;
   a front-rear contact including the active region and extending from the front surface to the rear surface; and
   wherein the section of the insulating trench across each plane parallel to the front surface has a non-uniform width transverse to the longitudinal line.

2. The device according to claim 1, wherein the device is of the SOI type with the chip including:
   a semiconductor substrate,
   an insulating layer lying on the substrate having at least one opening for the front-rear contact, the rear surface consisting of an exposed surface of the substrate opposite the insulating layer,
   a semiconductor active layer supported by the substrate and insulated from the substrate by the insulating layer with the exception of the at least one opening, the front surface consisting of an exposed surface of the active layer opposite the insulating layer,
   wherein the insulating trench extends from the front surface to the insulating layer, the active region comprising a portion of the active layer inside the insulating trench.

3. The device according to claim 2, wherein the front-rear contact includes a contact region surrounding the at least one opening, the contact region having a doping concentration higher than a doping concentration of the substrate and of the active layer.

4. The device according to claim 3, wherein the front-rear contact further includes at least one electrical contact on a contact window of the front surface, each point of the contact window being spaced apart from an axis of each opening.

5. The device according to claim 4, wherein a line between each point of the contact window and an edge of each opening at an interface between the insulating layer and the substrate forms an angle with the axis of the opening higher than a minimum value equal to 60°.

6. The device according to claim 1, wherein the chip comprises at least one semiconductor layer arranged between the front surface and the rear surface, and wherein the insulating trench extends from the front surface to the rear surface, the active region consisting of a portion of the at least one semiconductor layer inside the insulating trench.

7. The device according to claim 1, wherein the section includes a main portion having a uniform width along the longitudinal line and at least one projecting portion projecting inwards into the active region from the main portion.

8. The device according to claim 7, wherein each projecting portion includes at least one tapered element tapering inwards into the active region.

9. The device according to claim 8, wherein each tapered element of the projecting portion has a base width lower than the width of the main portion.

10. The device according to claim 9, wherein the base width of each tapered element is lower than a height thereof.

11. The device according to claim 8, wherein each tapered element has an axis of symmetry passing through a center of symmetry of the section.

12. The device according to claim 8, wherein the longitudinal line consists of a polygon having at least three sides, each tapered element of the projecting portion having an axis of symmetry perpendicular to the corresponding side.

13. The device according to claim 12, wherein the polygon has at least one pair of parallel sides, the tapered elements of each pair of parallel sides being staggered to each other.

14. The device according to claim 7, wherein the at least one projecting portion consists of at least one set of a plurality of projecting portions, the projecting portions of each set being uniformly arranged along the longitudinal line.

15. The device according to claim 14, wherein the at least one set comprises a plurality of sets, the sets of projecting portions being uniformly arranged along the longitudinal line.

* * * * *